(12) United States Patent
Kim et al.

(10) Patent No.: US 7,732,266 B2
(45) Date of Patent: Jun. 8, 2010

(54) THIN FILM ARRAY PANEL AND MANUFACTURING METHOD THEREOF

(75) Inventors: Sung-Man Kim, Seoul (KR); Young-Goo Song, Suwon-si (KR); Hyang-Shik Kong, Suwon-si (KR); Dong-Hyun Ki, Seoul (KR); Seong-Young Lee, Seoul (KR); Joo-Ae Yoon, Seongnam-si (KR); Jong-Woong Chang, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 12/172,701

(22) Filed: Jul. 14, 2008

(65) Prior Publication Data
US 2009/0014727 A1 Jan. 15, 2009

Related U.S. Application Data

(62) Division of application No. 10/902,251, filed on Jul. 29, 2004, now Pat. No. 7,411,216.

(30) Foreign Application Priority Data

Jul. 29, 2003 (KR) ...................... 10-2003-0052250
Sep. 5, 2003 (KR) ...................... 10-2003-0062202

(51) Int. Cl.
*H01L 21/00* (2006.01)
(52) U.S. Cl. ............................... 438/158; 257/E21.413
(58) Field of Classification Search .................. 438/158; 257/E21.413
See application file for complete search history.

(56) References Cited

U.S. PATENT DOCUMENTS

| 4,016,007 | A  | * | 4/1977 | Wada et al. ................. 438/297 |
| 5,477,355 | A  | * | 12/1995 | Sasaki et al. ................. 349/42 |
| 6,476,447 | B1 |   | 11/2002 | Yamazaki et al. |
| 6,778,232 | B2 | * | 8/2004 | Nakata et al. ................. 349/43 |
| 2002/0118318 | A1 | * | 8/2002 | Hidehira et al. .............. 349/43 |
| 2003/0013236 | A1 | * | 1/2003 | Nakata et al. ............... 438/149 |
| 2003/0168746 | A1 |   | 9/2003 | You |
| 2004/0189916 | A1 | * | 9/2004 | Song .......................... 349/139 |
| 2006/0226554 | A1 |   | 10/2006 | You |

FOREIGN PATENT DOCUMENTS

| CN | 1260509 | 7/2000 |
| CN | 1291298 | 4/2001 |
| JP | 62035669 | 2/1987 |

(Continued)

*Primary Examiner*—Charles D Garber
*Assistant Examiner*—Stanetta D Isaac
(74) *Attorney, Agent, or Firm*—Cantor Colburn LLP

(57) ABSTRACT

A thin film array panel is provided, which includes: a plurality of signal lines including contact parts for contact with an external device; a plurality of thin film transistors connected to the signal lines; an insulating layer formed on the signal lines and the thin film transistors; and a plurality of pixel electrodes formed on the insulating layer and connected to the thin film transistors, wherein the insulating layer includes a contact portion disposed on the contact parts of the signal lines and having a thickness smaller than other portions and the contact portion of the insulating layer includes an inclined portion having an inclination angle smaller than about 45 degrees.

8 Claims, 16 Drawing Sheets

FOREIGN PATENT DOCUMENTS

| | | |
|---|---|---|
| JP | 06160901 | 6/1994 |
| JP | 10020339 | 1/1998 |
| JP | 11153809 | 6/1999 |
| JP | 2002229058 | 8/2002 |
| JP | 2002229060 | 8/2002 |
| KR | 1998075921 A | 11/1998 |
| KR | 1020020087162 A | 11/2002 |
| KR | 1020050014057 | 2/2005 |

* cited by examiner

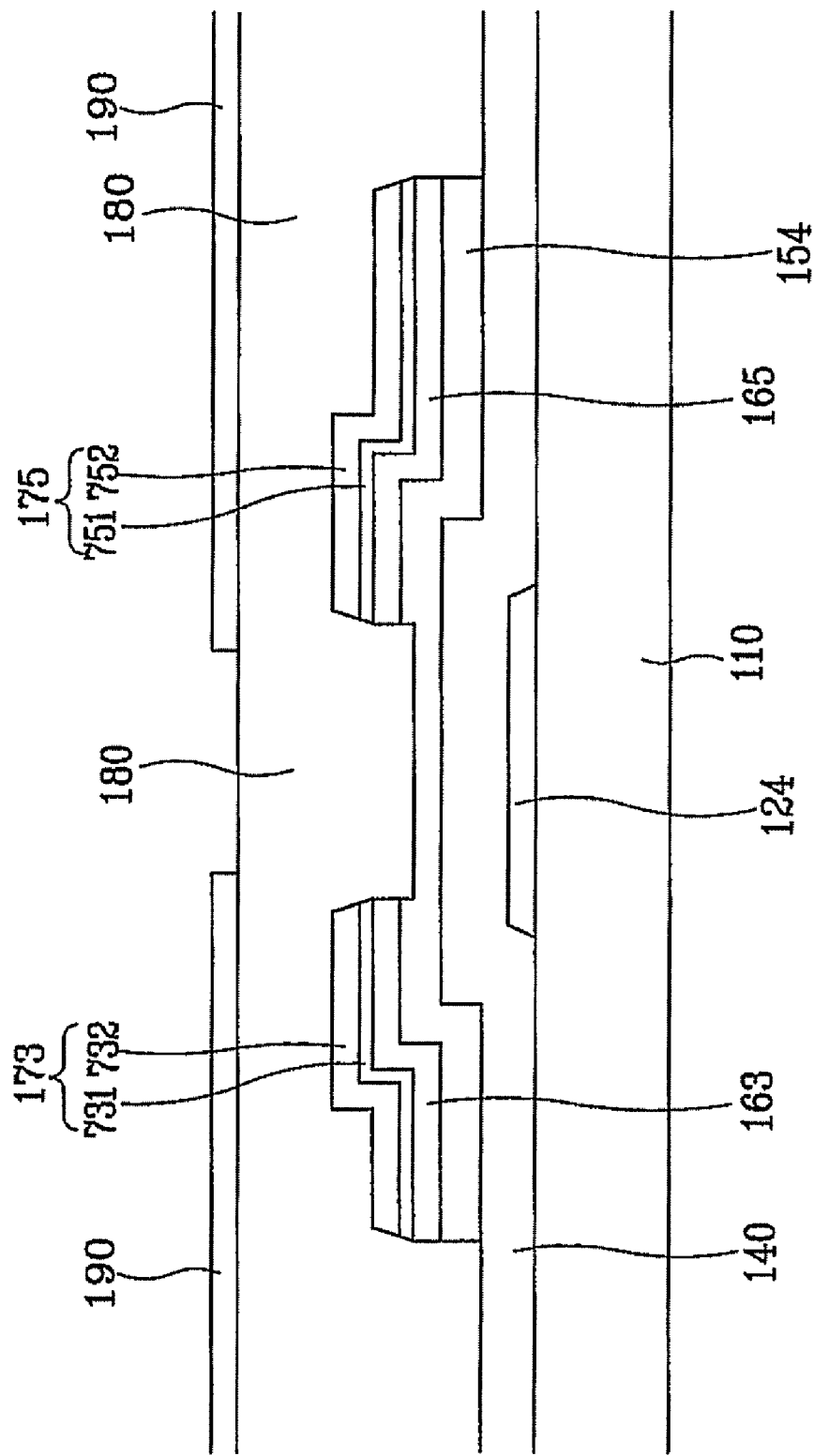

THIN FILM ARRAY PANEL AND MANUFACTURING METHOD THEREOF

CROSS REFERENCE TO RELATED APPLICATIONS

This application is a divisional application of U.S. application Ser. No. 10/902,251 filed Jul. 29, 2004, which claims priority to and the benefit of Korean Patent Application Nos. 10-2003-0062202, filed on Sep. 5, 2003 and 10-2003-0052250, filed on Jul. 29, 2003, all of which are incorporated by reference herein in their entirety.

BACKGROUND OF THE INVENTION (a) Field of the Invention

The present invention relates to a thin film array panel and a manufacturing method thereof.

(b) Description of the Related Art

Generally, a thin film array panel is used for display devices such as liquid crystal displays (LCDs) and organic light emitting displays (OLED).

The LCD is one of the most widely used flat panel displays since it is lightweight and occupies less space than conventional cathode ray tube (CRT) displays. The general structure of an LCD consists of a liquid crystal (LC) layer that is positioned between a pair of panels including field generating electrodes and polarizers. The LC layer is subjected to an electric field generated by the electrodes and variations in the field strength change the molecular orientation of the LC layer. For example, upon application of an electric field, the molecules of the LC layer change their orientation to change the polarization of light passing through the LC layer. Appropriately positioned polarizing filters selectively block the polarized light, creating dark areas that can represent desired images.

The thin film array panel for display device generally includes a plurality of pixel electrodes, a plurality of thin film transistors (TFTs) for controlling signals to be applied to the pixel electrodes, and a plurality of signal lines transmitting the signals and connected to external devices.

An aperture ratio is a significant factor of the LCD since it is related to the luminance of the LCD. The aperture ratio is generally increased by maximizing the size of the pixel electrodes such that the pixel electrodes overlap the signal lines with a passivation layer interposed. The passivation layer is made of organic material having low permittivity and has a thickness equal to about 3 microns in order to reduce the capacitive coupling between the pixel electrodes and the signal lines.

However, the thick passivation layer makes steep height difference at contacts between the signal lines and the external devices, which may cause the defect in the contacts and deteriorate the reliability of the contacts.

SUMMARY OF THE INVENTION

A motivation of the present invention is to solve the problems of the conventional art.

A thin film array panel is provided, which includes: a plurality of signal lines including contact parts for contact with an external device; a plurality of thin film transistors connected to the signal lines; an insulating layer formed on the signal lines and the thin film transistors; and a plurality of pixel electrodes formed on the insulating layer and connected to the thin film transistors, wherein the insulating layer includes a contact portion disposed on the contact parts of the signal lines and having a thickness smaller than other portions and the contact portion of the insulating layer includes an inclined portion having an inclination angle smaller than about 45 degrees.

The inclination angle of the inclined portion may be in a range about 5-10 degrees and the inclined portion may have a width in a range about 10-40 microns.

The pixel electrodes may overlap the signal lines.

The insulating layer may include organic insulator.

The insulating layer may have a plurality of contact holes exposing the contact parts of the signal lines and the thin film array panel may further include a plurality of contact assistants including the same layer as the pixel electrodes and connected to the contact parts of the signal lines through the contact holes.

The contact holes may expose edges of the contact parts of the signal lines.

The signal lines may include gate lines and data lines intersecting each other.

The thin film transistors may include gate electrodes included in the gate lines, source electrodes included in the data lines, drain electrodes connected to the pixel electrodes, and semiconductor members disposed between the source electrodes and the drain electrodes.

The semiconductor members may extend along the data lines, and in addition, the semiconductor members may have substantially the same planar shape as the data lines and the drain electrodes except for a portion between the source electrode and the drain electrode.

The pixel electrode may include ITO or IZO.

A method of manufacturing a thin film array panel is provided, which includes: forming a gate conductor formed on a substrate; forming a gate insulating layer on the gate conductor; forming a semiconductor layer on the gate insulating layer; forming a data conductor at least on the semiconductor layer; forming a passivation layer on the semiconductor layer, the passivation layer including a first portion having a contact hole on one of the gate conductor or the data conductor for connection with an external device, a second portion thicker than the first portion, and a third portion disposed between the first portion and the second portion and having an inclined angle smaller than about 45 degrees; and forming a pixel electrode connected to the drain electrode.

The inclination angle of the third portion may be in a range about 5-10 degrees.

The formation of the passivation layer may include light exposure using a mask including a first area facing the first and the third portions of the passivation layer and partly transmitting light, a second area facing the contact hole and substantially fully transmitting light, and a third area facing the second portion and substantially fully blocking light.

The first area may include a plurality of slits or a plurality of lattices.

The distance between the slits or the lattices may be increased or the width of the slits or lattices may be decreased as goes to the third area.

The slits may include a plurality of first slits facing the first area and a plurality of second slits facing the third area, the distance between the first slits being substantially constant and the distance between the second slits being increased as goes to the third area.

The passivation layer may include organic insulator and the pixel electrode may include ITO or IZO.

BRIEF DESCRIPTION OF THE DRAWINGS

The present invention will become more apparent by describing embodiments thereof in detail with reference to the accompanying drawings in which:

FIG. 16B is a sectional view of the TFT array panel shown in FIG. 15 taken along the lines XVIB-XVIB'.

DETAILED DESCRIPTION OF EMBODIMENTS

Figure 1:
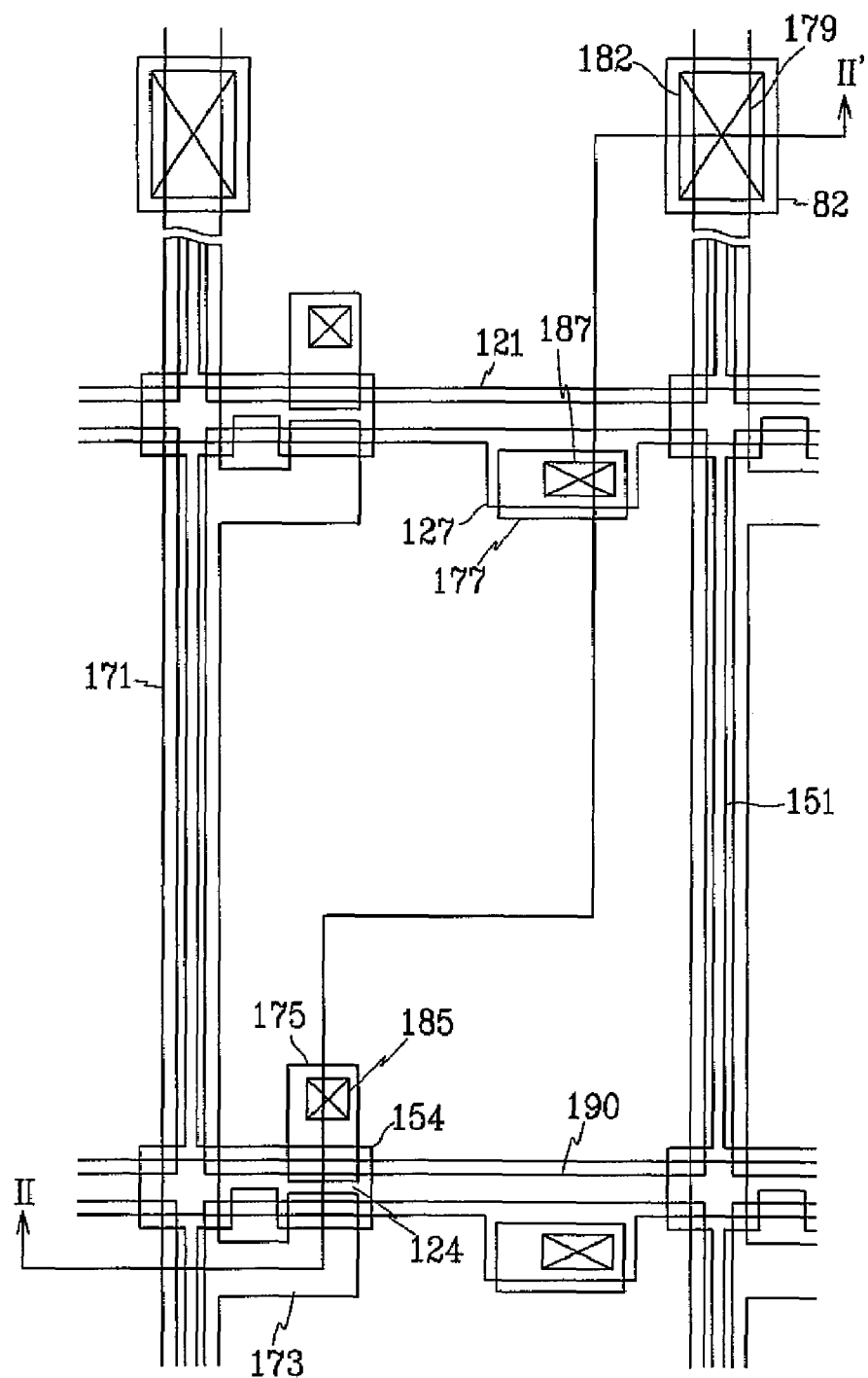
FIG. 1 is an exemplary layout view of a TFT array panel according to an embodiment of the present invention.

The present invention now will be described more fully hereinafter with reference to the accompanying drawings, in which preferred embodiments of the invention are shown. The present invention may, however, be embodied in many different forms and should not be construed as limited to the embodiments set forth herein.

In the drawings, the thickness of layers, films and regions are exaggerated for clarity. Like numerals refer to like elements throughout. It will be understood that when an element such as a layer, film, region or substrate is referred to as being "on" another element, it can be directly on the other element or intervening elements may also be present. In contrast, when an element is referred to as being "directly on" another element, there are no intervening elements present.

Now, TFT array panels and manufacturing methods thereof according to embodiments of the present invention will be described with reference to the accompanying drawings.

A TFT array panel for an LCD will be described in detail with reference to FIGS. 1-4, 14A and 14B.

Figure 2:
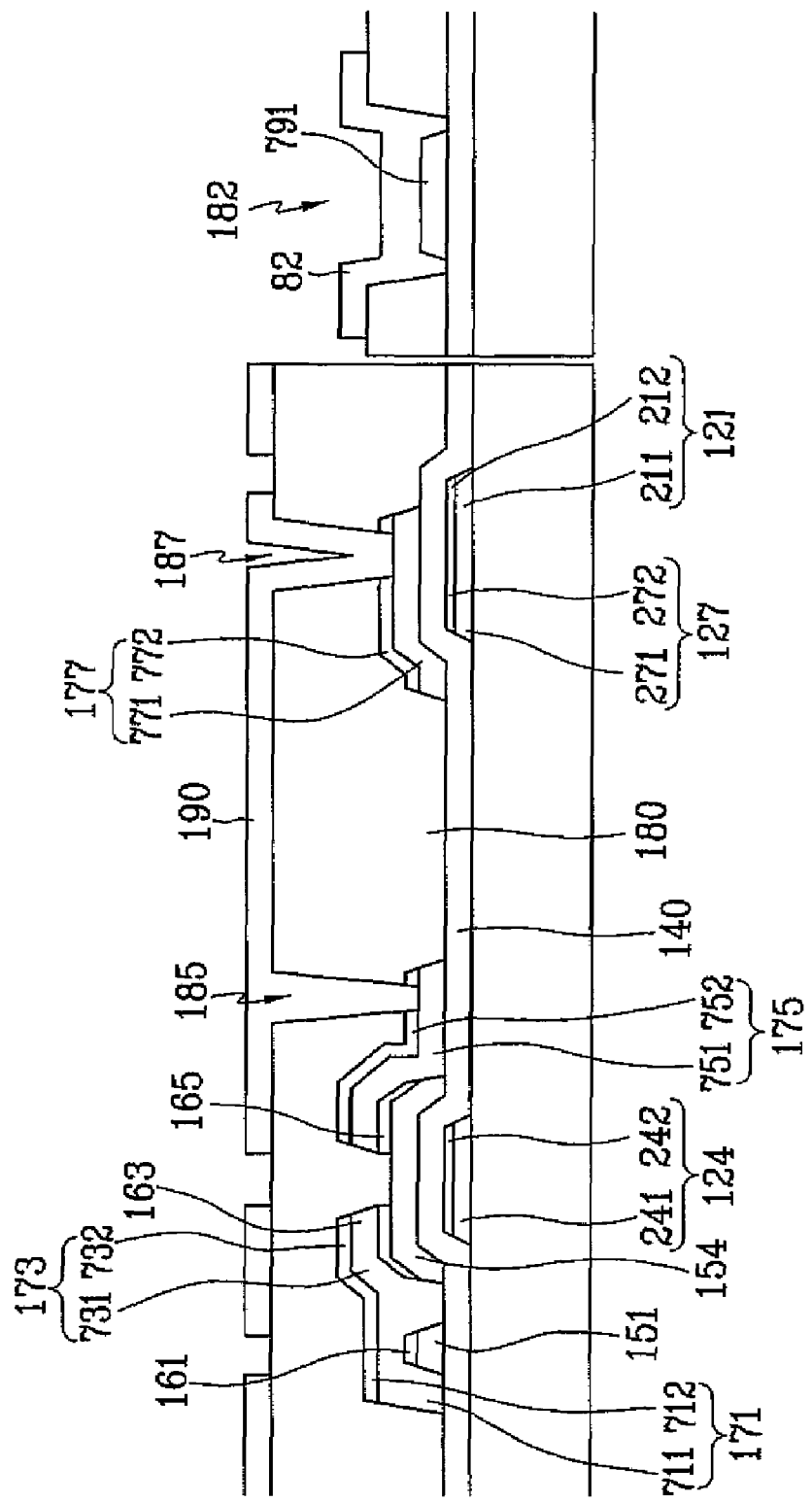
FIG. 2 is a sectional view of the TFT array panel shown in FIG. 1 taken along the line II-II'.
Figure 3:
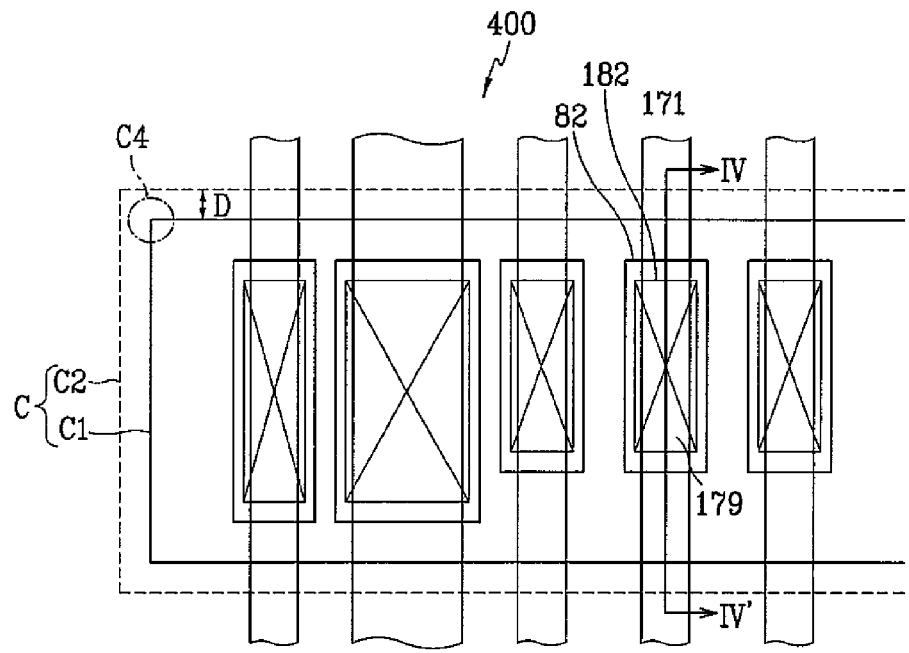
FIG. 3 is a layout view of a peripheral area in the TFT array panel shown in FIG. 1.
Figure 4:
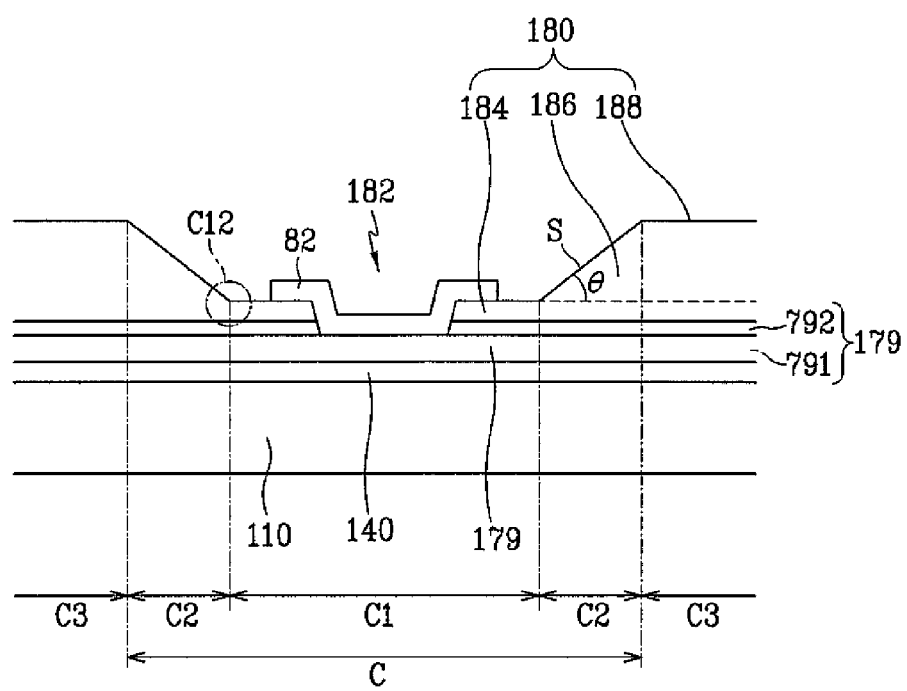
FIG. 4 is a sectional view of the contact area shown in FIG. 3 taken along the line IV-IV'.
Figure 14A:
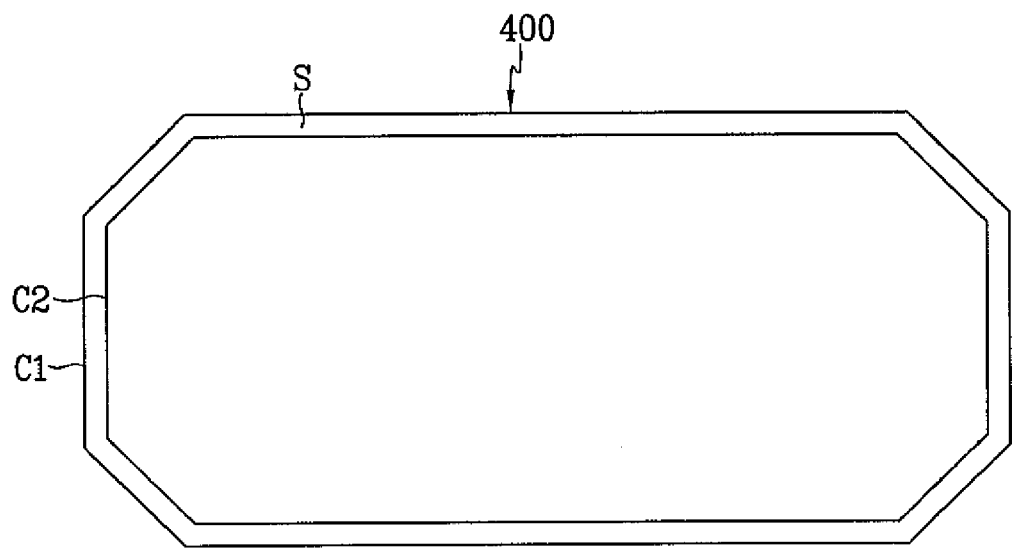
FIGS. 14A and 14B are schematic layout views of examples of a contact area and an intermediate area in the TFT array panel shown in FIGS. 1-4.
Figure 14B:
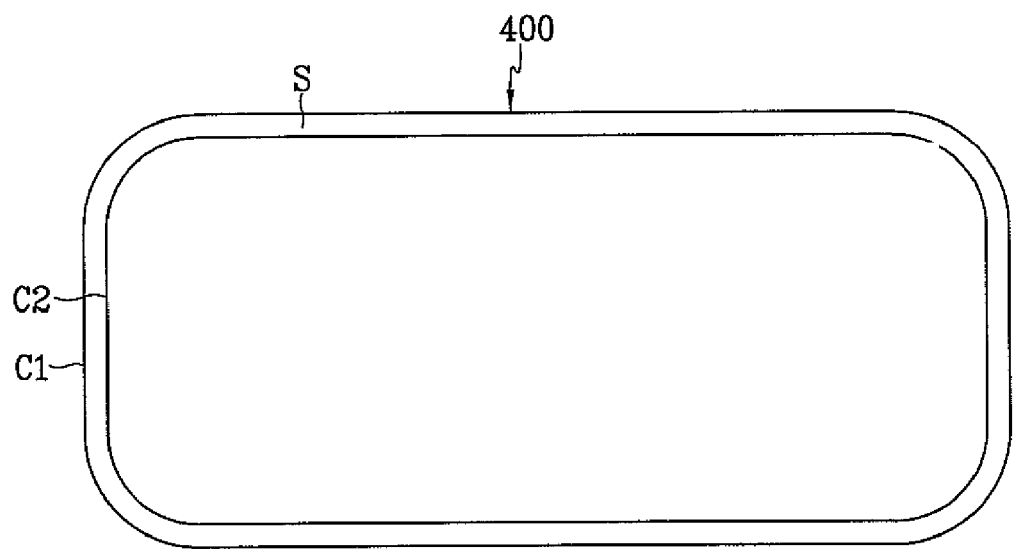

FIG. 1 is an exemplary layout view of a TFT array panel according to an embodiment of the present invention, FIG. 2 is a sectional view of the TFT array panel shown in FIG. 1 taken along the line II-II', FIG. 3 is a layout view of a peripheral area in the TFT array panel shown in FIG. 1, and FIG. 4 is a sectional view of the contact area shown in FIG. 3 taken along the line IV-IV'. FIGS. 14A and 14B are schematic layout views of examples of a contact area and an intermediate area in the TFT array panel shown in FIGS. 1-4.

A plurality of gate lines 121 for transmitting gate signals are formed on an insulating substrate 110. Each gate line 121 extends substantially in a transverse direction and it includes a plurality of portions forming a plurality of gate electrodes 124 and a plurality of projections 127 protruding downward. The gate lines 121 may extend to be connected to a driving circuit (not shown) integrated on the substrate 110, or it may have an end portion (not shown) having a large area for connection with another layer or an external driving circuit mounted on the substrate 110 or on another device such as a flexible printed circuit film (not shown) that may be attached to the substrate 110.

The gate lines 121 include two films having different physical characteristics, a lower film 211 and an upper film 212. The upper film 211 is preferably made of low resistivity metal including Al containing metal such as Al and Al alloy for reducing signal delay or voltage drop in the gate lines 121. On the other hand, the lower film 212 is preferably made of material such as Cr, Mo, Mo alloy, Ta and Ti which has good physical, chemical, and electrical contact characteristics with other materials such as indium tin oxide (ITO) and indium zinc oxide (IZO). A good exemplary combination of the lower film material and the upper film material is Cr and Al—Nd alloy. In FIG. 2, the lower and the upper films of the gate electrodes 124 are indicated by reference numerals 241 and 242, respectively, and the lower and the upper films of the projections 127 are indicated by reference numerals 271 and 272, respectively.

However, the gate lines 121 may include a single layer preferably made of Al containing metal, Ag containing metal such as Ag and Ag alloy, Cu containing metal such as Cu and Cu alloy, Cr, Mo, Mo alloy, Ta, or Ti. Alternatively, the gate lines 121 may have a multi-layered structure including at least three layers.

In addition, the lateral sides of the gate lines 121 are inclined relative to a surface of the substrate 110, and the inclination angle thereof ranges about 30-80 degrees.

A gate insulating layer 140 preferably made of silicon nitride (SiNx) is formed on the gate lines 121.

A plurality of semiconductor stripes 151 preferably made of hydrogenated amorphous silicon (abbreviated to "a-Si") are formed on the gate insulating layer 140. Each semiconductor stripe 151 extends substantially in the longitudinal direction and has a plurality of projections 154 branched out toward the gate electrodes 124. The width of each semiconductor stripe 151 becomes large near the gate lines 121 such that the semiconductor stripe 151 covers large areas of the gate lines 121.

A plurality of ohmic contact stripes and islands 161 and 165 preferably made of silicide or n+ hydrogenated a-Si heavily doped with n type impurity are formed on the semiconductor stripes 151. Each ohmic contact stripe 161 has a plurality of projections 163, and the projections 163 and the ohmic contact islands 165 are located in pairs on the projections 154 of the semiconductor stripes 151.

The lateral sides of the semiconductor stripes 151 and the ohmic contacts 161 and 165 are inclined relative to a surface of the substrate 110, and the inclination angles thereof are preferably in a range about 30-80 degrees.

A plurality of data lines 171, a plurality of drain electrodes 175, and a plurality of storage capacitor conductors 177 are formed on the ohmic contacts 161 and 165 and the gate insulating layer 140.

The data lines 171 for transmitting data voltages extend substantially in the longitudinal direction and intersect the gate lines 121. Each data line 171 includes an end portion 179 for contact with another layer or an external device. The end portions 179 of the data lines 171 are gathered at a peripheral area 400 as shown in FIG. 3, and they may have increased areas for enhancing the contact.

A plurality of branches of each data line 171, which project toward the drain electrodes 175, form a plurality of source electrodes 173. Each pair of the source electrodes 173 and the drain electrodes 175 are separated from each other and opposite to each other with respect to a gate electrode 124. A gate electrode 124, a source electrode 173, and a drain electrode 175 along with a projection 154 of a semiconductor stripe 151 form a TFT having a channel formed in the projection 154 disposed between the source electrode 173 and the drain electrode 175.

The storage capacitor conductors 177 overlap the projections 127 of the gate lines 121.

The data lines 171, the drain electrodes 175, and the storage capacitor conductors 177 also include a lower film 711, 751 and 771 preferably made of Mo, Mo alloy or Cr and an upper film 712, 752 and 772 located thereon and preferably made of Al containing metal. In FIGS. 2 and 4, the lower and the upper films of the source electrodes 173 are indicated by reference numerals 731 and 732, respectively, and the lower and the upper films of the end portions 179 are indicated by reference numerals 791 and 792, respectively. Portions of the upper films 752, 772 and 792 are removed to expose the underlying portions of the lower films 751, 772 and 792 and thus there are edges of the upper films 752, 772 and 792 disposed on the lower films 751, 772 and 792. Alternatively, the data lines 171, etc., may include only a single layer or triple layers with a middle layer of Al or Al alloy interposed.

Like the gate lines 121, the data lines 171, the drain electrodes 175, and the storage capacitor conductors 177 have tapered lateral sides relative to a surface of the substrate 110, and the inclination angles thereof range about 30-80 degrees.

The ohmic contacts 161 and 165 are interposed only between the underlying semiconductor stripes 151 and the overlying data lines 171 and the overlying drain electrodes 175 thereon and reduce the contact resistance therebetween. The semiconductor stripes 151 include a plurality of exposed portions, which are not covered with the data lines 171 and the drain electrodes 175, such as portions located between the source electrodes 173 and the drain electrodes 175. Although the semiconductor stripes 151 are narrower than the data lines 171 at most places, the width of the semiconductor stripes 151 becomes large near the gate lines 121 as described above, to smooth the profile of the surface, thereby preventing the disconnection of the data lines 171.

A passivation layer 180 is formed on the data lines 171, the drain electrodes 175, the storage electrode capacitors 177, and exposed portions of the semiconductor stripes 151, which are not covered with the data lines 171 and the drain electrodes 175. The passivation layer 180 is preferably made of photosensitive organic material having a good flatness characteristic, or low dielectric insulating material such as a-Si: C:O and a-Si:O:F formed by plasma enhanced chemical vapor deposition (PECVD). The passivation layer 180 may have a double-layered structure including a lower inorganic film and an upper organic film to prevent the direct contact between semiconductor and organic material.

The passivation layer 180 has a plurality of contact holes 182, 185 and 187 exposing the end portions 179 of the data lines 171, the drain electrodes 175, and the storage conductors 177, respectively.

The contact holes 182, 185 and 187 expose the lower films 791, 751 and 771. Furthermore, the contact holes 182 expose edges of the end portions 179 of the data lines.

Referring to FIGS. 3 and 4, the passivation layer 180 includes a contact portion C including a thin portion 184 disposed on a contact area C1 around the contact holes 182 and an inclined portion 186 disposed on an intermediate area C2 around the contact area C1, and a thick portion 188 disposed on a remaining area C3 around the intermediate area C2. The inclined portion 186 has an inclination angle θ preferably smaller than about 45 degrees with respect to a surface of the substrate 110. More preferably, the inclination angle θ is in a range about 5-10 degrees.

The thickness of the thick portion 188 is equal to about 3 microns, while the thickness of the thin portion 186 is equal to about 4,000-5,000 Å. The width D of the inclined portion 186 preferably ranges about 10-40 microns.

Although FIG. 3 shows that the areas C1 and C2 are rectangular, it is preferable that the areas C1 and C2 have a shape of rectangle having chamfered corners as shown in FIG. 14A or rounded corners as shown in FIG. 14B.

A plurality of pixel electrodes 190 and a plurality of contact assistants 82, which are preferably made of ITO or IZO, are formed on the passivation layer 180.

The pixel electrodes 190 are physically and electrically connected to the drain electrodes 175 through the contact holes 185 and to the storage capacitor conductors 177 through the contact holes 187 such that the pixel electrodes 190 receive the data voltages from the drain electrodes 175 and transmit the received data voltages to the storage capacitor conductors 177.

The pixel electrodes 190 supplied with the data voltages generate electric fields in cooperation with a common electrode (not shown) on another panel (not shown), which reorient liquid crystal molecules in a liquid crystal layer (not shown) disposed therebetween.

A pixel electrode 190 and a common electrode form a liquid crystal capacitor, which stores applied voltages after turn-off of the TFT. An additional capacitor called a "storage capacitor," which is connected in parallel to the liquid crystal capacitor, is provided for enhancing the voltage storing capacity. The storage capacitors are implemented by overlapping the pixel electrodes 190 with the gate lines 121 adjacent thereto (called "previous gate lines"). The capacitances of the storage capacitors, i.e., the storage capacitances are increased by providing the projections 127 at the gate lines 121 for increasing overlapping areas and by providing the storage capacitor conductors 177, which are connected to the pixel electrodes 190 and overlap the projections 127, under the pixel electrodes 190 for decreasing the distance between the terminals.

The pixel electrodes 190 may overlap the gate lines 121 and the data lines 171 to increase aperture ratio but it is optional.

The contact assistants 82 cover the contact holes 182 to be connected to the exposed end portions 179 of the data lines 171 through the contact holes 182 and they are disposed on the thin portion 184 of the passivation layer 180 as shown in FIGS. 3 and 4. The contact assistants 82 protect the exposed portions 179 and complement the adhesion between the exposed portions 179 and external devices.

An out lead bonding pad of a flexible printed circuit film (not shown) preferably mounting a driving circuit chip (not shown) or a bump pad of a driving circuit chip (not shown) is disposed on each contact assistant 82 with preferably interposing an anisotropic film (not shown) containing several conductive particles. The provision of the thin portion 184 enhances the reliability of the contact between the contact assistants 82 and the pads and it prevents the pads from getting loose.

The gate lines 121 may have a similar contact configuration.

In the meantime, the exposure of the edges of the lower film 791 of the end portions 179 through the contact holes 182 prevents the disconnection of the contact assistants 82 at the contact holes 182. Portions of the contact assistants 82 near an edge of the contact hole 182 disposed on the lower film 791 may be disconnected due to the undercut of the upper film 792 at the edge of the contact hole 182. The undercut means that a portion of the upper film 792 under the passivation layer 180 at the edge of the contact hole 182 is removed to place the boundary of the upper film 792 under the passivation layer 180 such that the sidewall of the contact hole 182 has a hole or a depression. However, the other edge of the contact hole 182 disposed directly on the gate insulating layer 140 does not have such undercut. Accordingly, the contact assistants 82 contact the end portions 179 with a smooth profile, thereby securing the reliable contact therebetween.

According to another embodiment of the present invention, the pixel electrodes 190 are made of transparent conductive polymer. For a reflective LCD, the pixel electrodes 190 are made of opaque reflective metal. In these cases, the contact assistants 82 may be made of material such as ITO or IZO different from the pixel electrodes 190.

A method of manufacturing the TFT array panel shown in FIGS. 1-4 according to an embodiment of the present invention will be now described in detail with reference to FIGS. 5 to 12 as well as FIGS. 1-4.

FIGS. 5, 7, 9 and 11 are layout views of the TFT array panel shown in FIGS. 1-4 in intermediate steps of a manufacturing method thereof according to an embodiment of the present invention, and FIGS. 6, 8, 10 and 12 are sectional views of the TFT array panel shown in FIGS. 5, 7, 9 and 11 taken along the lines VI-VI', VIII-VIII', X-X', and XII-XII', respectively. FIG. 13 is a sectional view of a contact area of the TFT array panel in an intermediate step of the manufacturing method.

Two conductive films, a lower conductive film and an upper conductive film are sputtered in sequence on an insulating substrate 110 such as transparent glass. The lower conductive film is preferably made of a metal such as Cr, Mo, and Mo alloy, which has good contact characteristics with ITO or IZO, and it has a thickness of about 500 Å. The upper conductive film is preferably made of Al containing metal and preferably has a thickness of about 2,500 Å.

Figure 5:
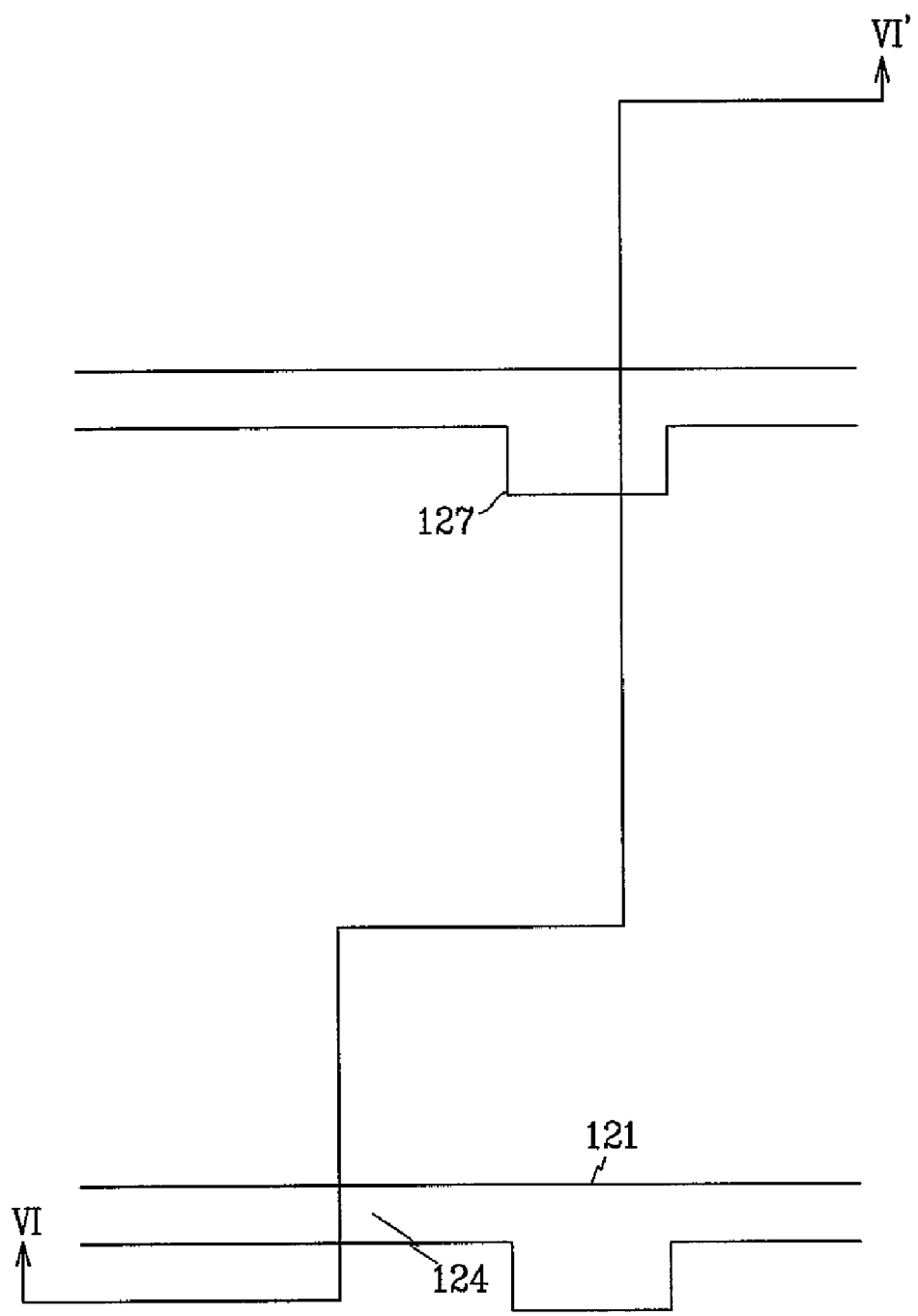
FIGS. 5, 7, 9 and 11 are layout views of the TFT array panel shown in FIGS. 1-4 in intermediate steps of a manufacturing method thereof according to an embodiment of the present invention.
Figure 6:
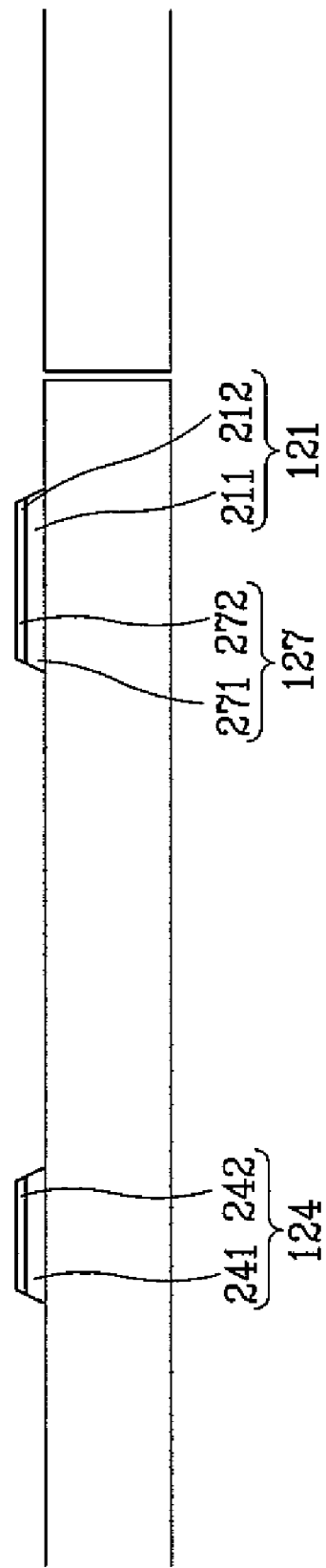
FIGS. 6, 8, 10 and 12 are sectional views of the TFT array panel shown in FIGS. 5, 7, 9 and 11 taken along the lines VI-VI', VIII-VIII', X-X', and XII-XII', respectively.

Referring to FIGS. 5 and 6, the upper conductive film and the lower conductive film are patterned in sequence by photo-etching with a photoresist pattern to form a plurality of gate lines 121 including a plurality of gate electrodes 124 and a plurality of projections 127. Although the lower and the upper films 211 and 212 may be separately etched under different conditions, they may be simultaneously etched preferably using an Al etchant including 8-15% $CH_3COOH$, 5-8% $HNO_3$, 50-60% $H_3PO_3$, and remaining $H_2O$, which can etch both Al and Mo with giving inclined etch profiles.

Figure 7:
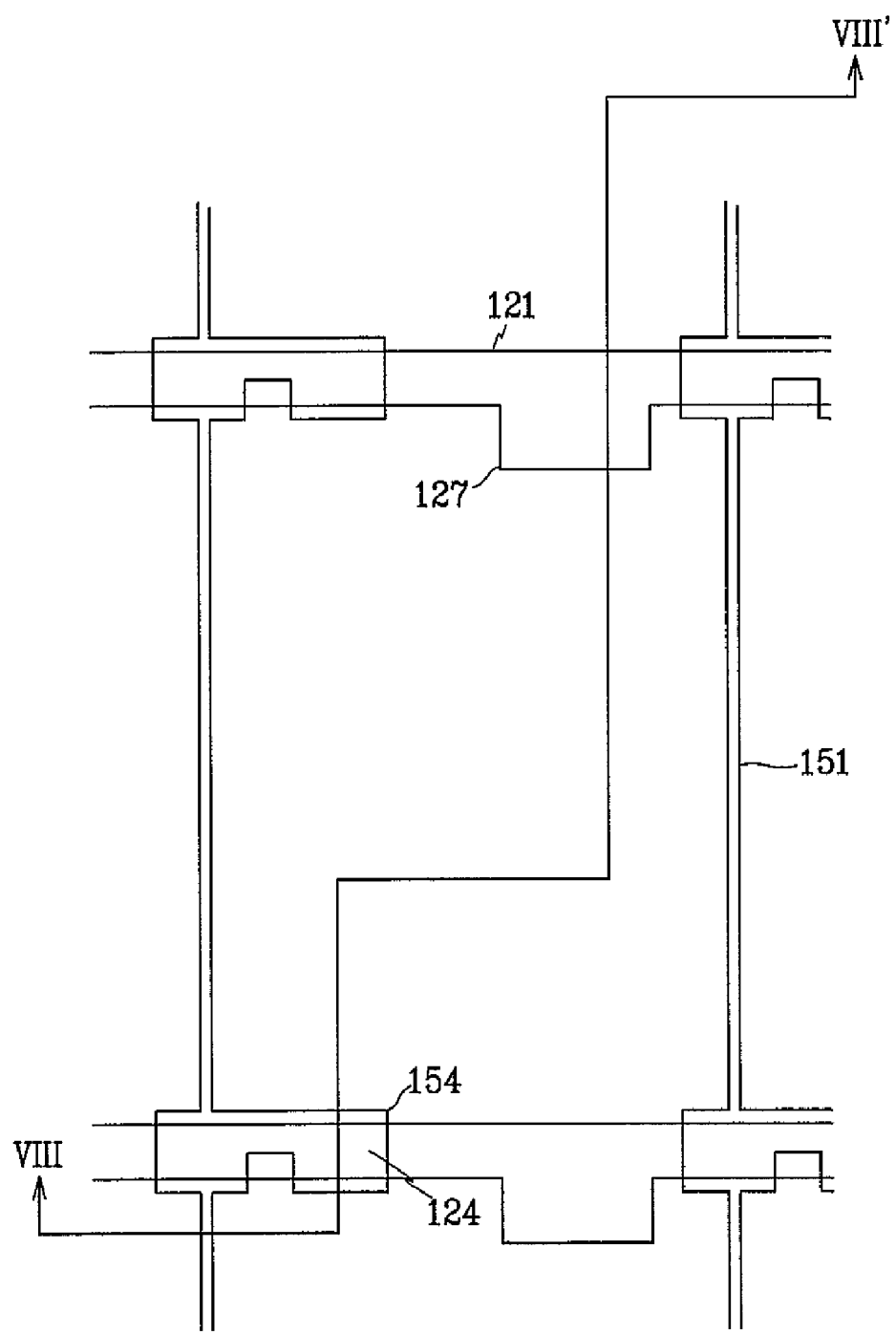
Figure 8:
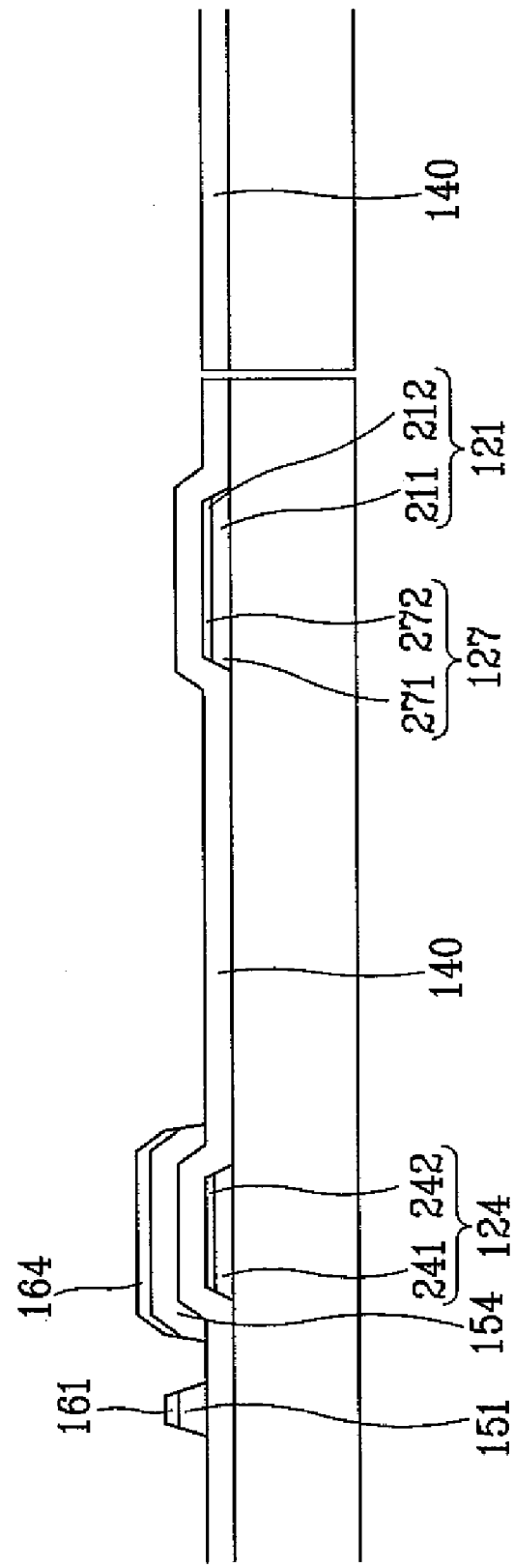

Referring to FIGS. 7 and 8, after sequential deposition of a gate insulating layer 140, an intrinsic a-Si layer, and an extrinsic a-Si layer, the extrinsic a-Si layer and the intrinsic a-Si layer are photo-etched to form a plurality of extrinsic semiconductor stripes 164 and a plurality of intrinsic semiconductor stripes 151 including a plurality of projections 154 on the gate insulating layer 140. The gate insulating layer 140 is preferably made of silicon nitride with thickness of about 2,000 Å to about 5,000 Å, and the deposition temperature is preferably in a range about 250-500° C.

Figure 9:
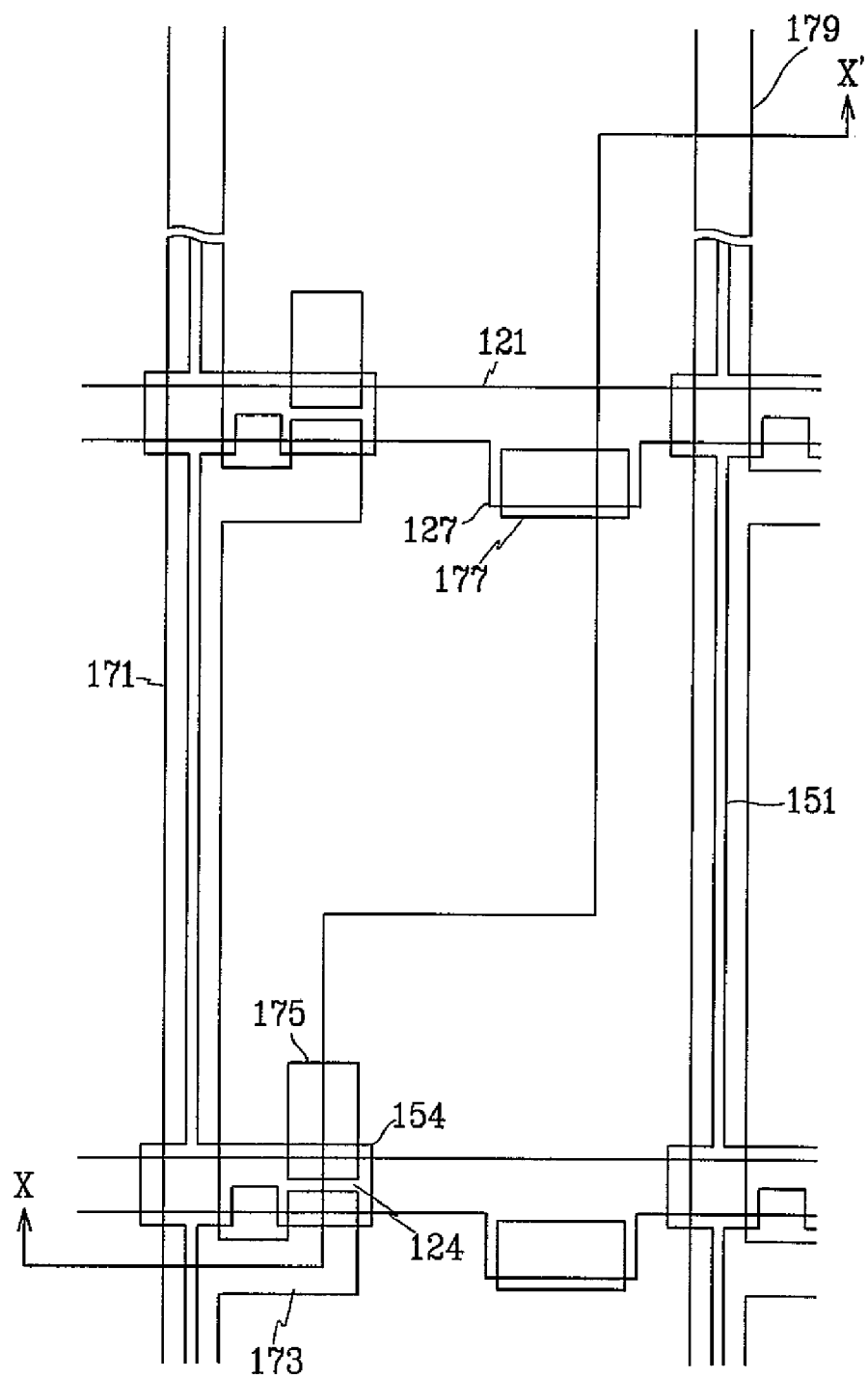
Figure 10:
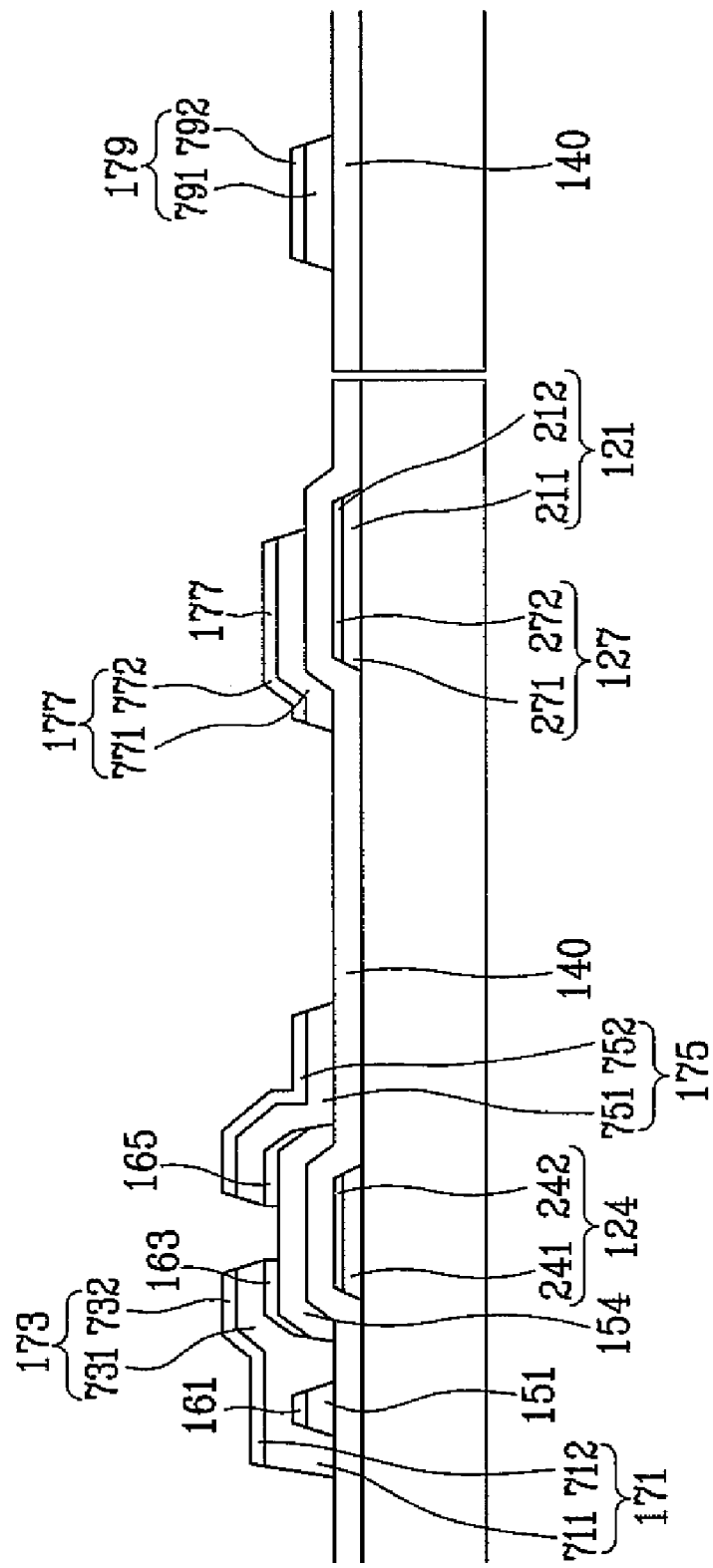

Referring to FIGS. 9 and 10, a conductive layer is sputtered and etched using a photoresist film (not shown) to form a plurality of data lines 171 including a plurality of source electrodes 173, a plurality of drain electrodes 175, and a plurality of storage capacitor conductors 177.

Before or after removing the photoresist film, portions of the extrinsic semiconductor stripes 164, which are not covered with the data lines 171, the drain electrodes 175, and the storage capacitor conductors 177, are removed by etch to complete a plurality of ohmic contact stripes 161 including a plurality of projections 163 and a plurality of ohmic contact islands 165 and to expose portions of the intrinsic semiconductor stripes 151. In case that the exposed portions of the extrinsic semiconductor stripes 164 is removed using the data lines 171, the drain electrodes 175, and the storage capacitor conductors 177 as an etch mask after removing the photoresist film, the extrinsic semiconductor stripes 164 are dry etched preferably using $CF_4$+HCl in order to prevent the damage on the Mo containing films of the data lines 171, etc.

Oxygen plasma treatment may follow thereafter in order to stabilize the exposed surfaces of the semiconductor stripes 151.

Figure 11:
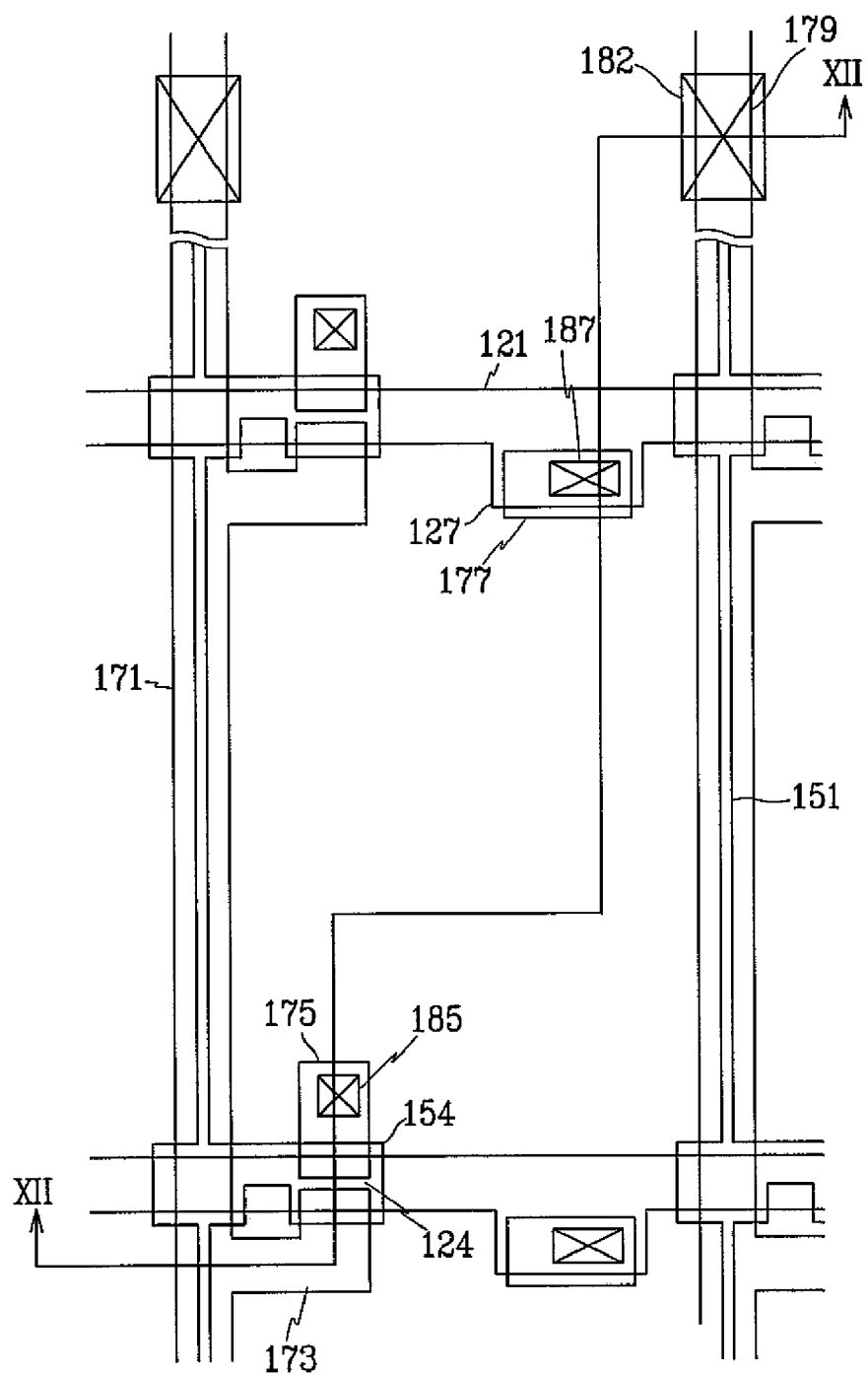
Figure 12:
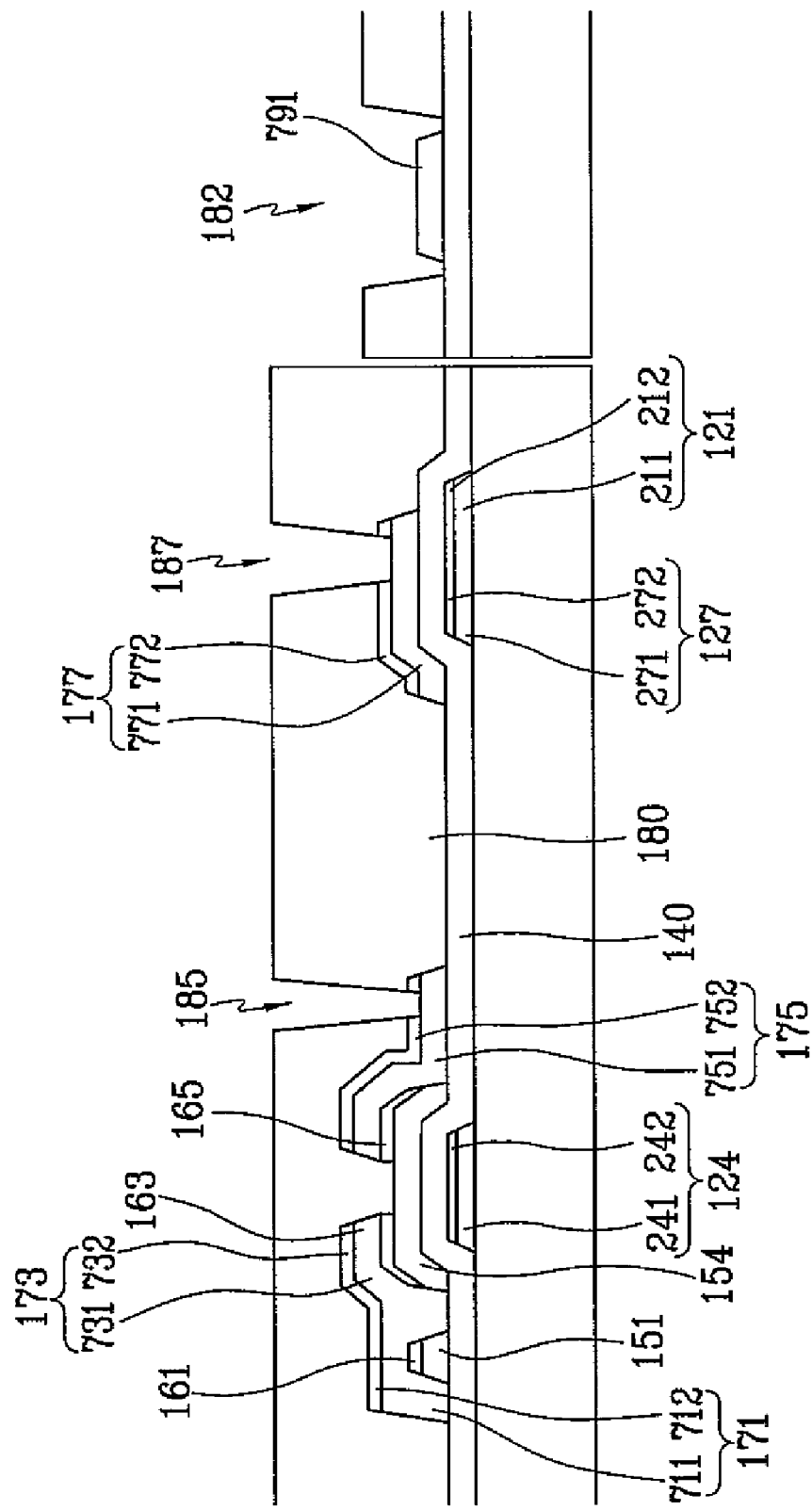
Figure 13:
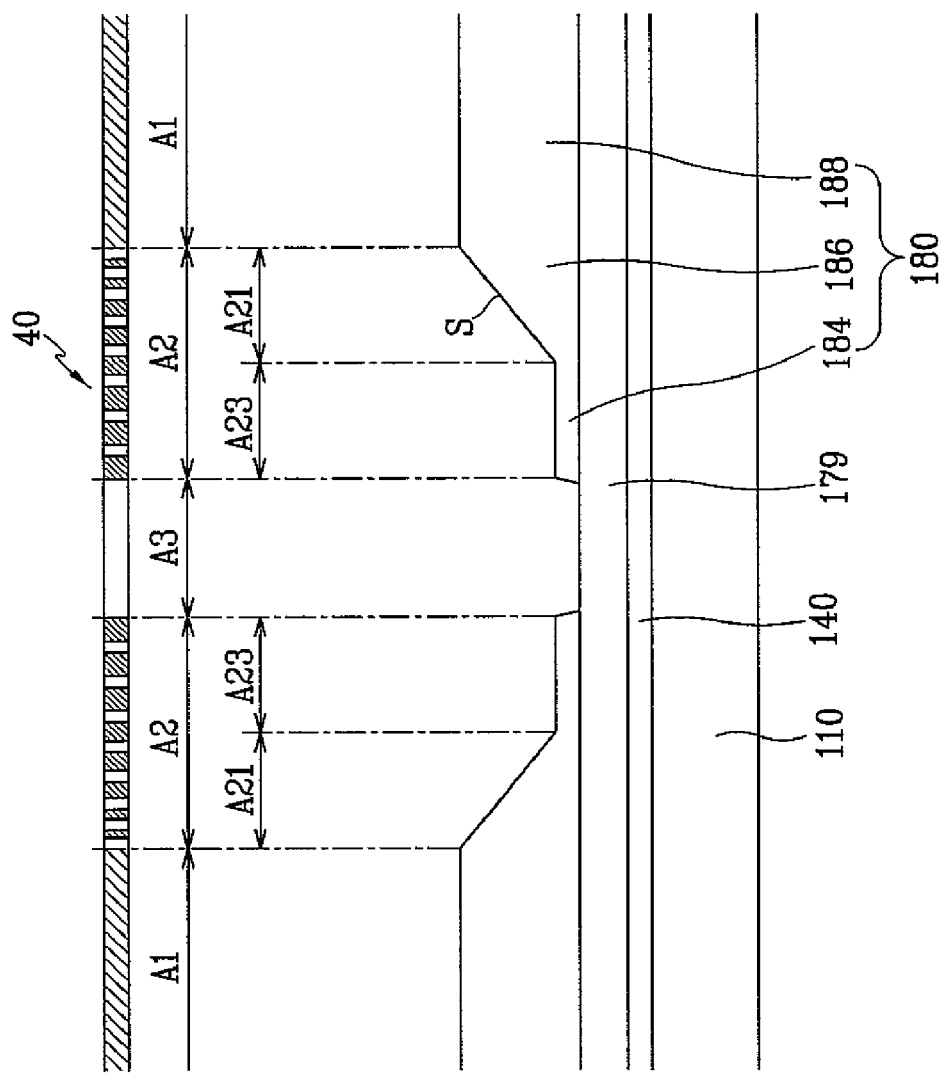
FIG. 13 is a sectional view of a contact area of the TFT array panel in an intermediate step of the manufacturing method.

Referring to FIGS. 11 and 12, a passivation layer 180 made of photosensitive organic material is coated and subjected to light exposure and development to form a plurality of contact holes 182, 185 and 187 exposing the end portions 179 of the data lines 171, the drain electrodes 175, and the storage capacitor conductors 177.

In the meantime, the stepped profile of the passivation layer 180 at the peripheral area 400 is formed by using an exposure mask 40 including a light blocking area A1, a slit area A2, and a plurality of light transmitting areas A3 as shown in FIG. 13. Furthermore, the slit area A2 is divided into two subareas A21 and A23 having different arrangements of the slits. The subarea A23 facing the contact portion 184 of the passivation layer 180 has a uniform distance between the slits, while the subarea A21 facing the inclined portion 186 of the passivation layer 180 has a varying slit distance. The slit distance in the subarea A21 increases as it goes to the light blocking area A1, and the distance between the slits and the width of the slits are preferably smaller than the resolution of an exposer.

For example, the width of the slits is equal to about 1.3 microns and the slit distance in the subarea A23 is equal to about 1.3 microns. The subarea 21 has four slit with the slit distance equal to about 1.3 microns, four slits with the slit distance equal to about 1.8 microns, and four slits with the slit distance equal to about 2.3 microns, which are sequential arranged from the subarea A23 to the light blocking area A1. According to an experiment, the inclined angle θ of about 5-6 degrees were obtained by using the exposure mask 40.

The inclined portion 86 may be also obtained by varying the width of the slits.

The exposure mask 40 may include a lattice area (not shown) instead of the slit area A2 or a thin film having an intermediate transmittance or an intermediate thickness between those of the light blocking area A1 and the light transmitting areas A3. When using the lattice area, the inclined portion 186 can be obtained by varying the distance or the width of lattices in the lattice area.

The stepped profile of the passivation layer 180 may be also obtained by reflowing the photoresist after exposing and developing the photo resist film using an exposure mask including only a light blocking area and light transmitting areas.

Referring to FIGS. 1-4, a transparent conductive layer made of ITO or IZO is sputtered and a photoresist film (not shown) is coated thereon. The photoresist film is subjected to light exposure and developed to form a photoresist pattern (not shown). The transparent conductive layer is then etched to form a plurality of pixel electrodes 190 and a plurality of contact assistants 82 are formed on the second passivation layer 802.

According to an experiment, when the inclined angle θ was large, the photoresist film was thicker at a boundary C12 between the contact areas C1 and the intermediate area C2 than at other places, and in particular, it was much thicker at the corners C4 of the boundary C12. After the development of the photoresist film, photoresist residue was remained at the boundary C12 and unwanted ITO or IZO pattern is formed there, thereby causing short circuit between the signal lines. However, no ITO or IZO remnant was observed at the boundary C12 particularly for the areas C1 and C2 shown in FIGS. 14A and 14B when the inclined angle θ was smaller than about 45 degrees.

A TFT array panel for an LCD according to another embodiment of the present invention will be described in detail with reference to FIGS. 15, 16A and 16B.

Figure 15:
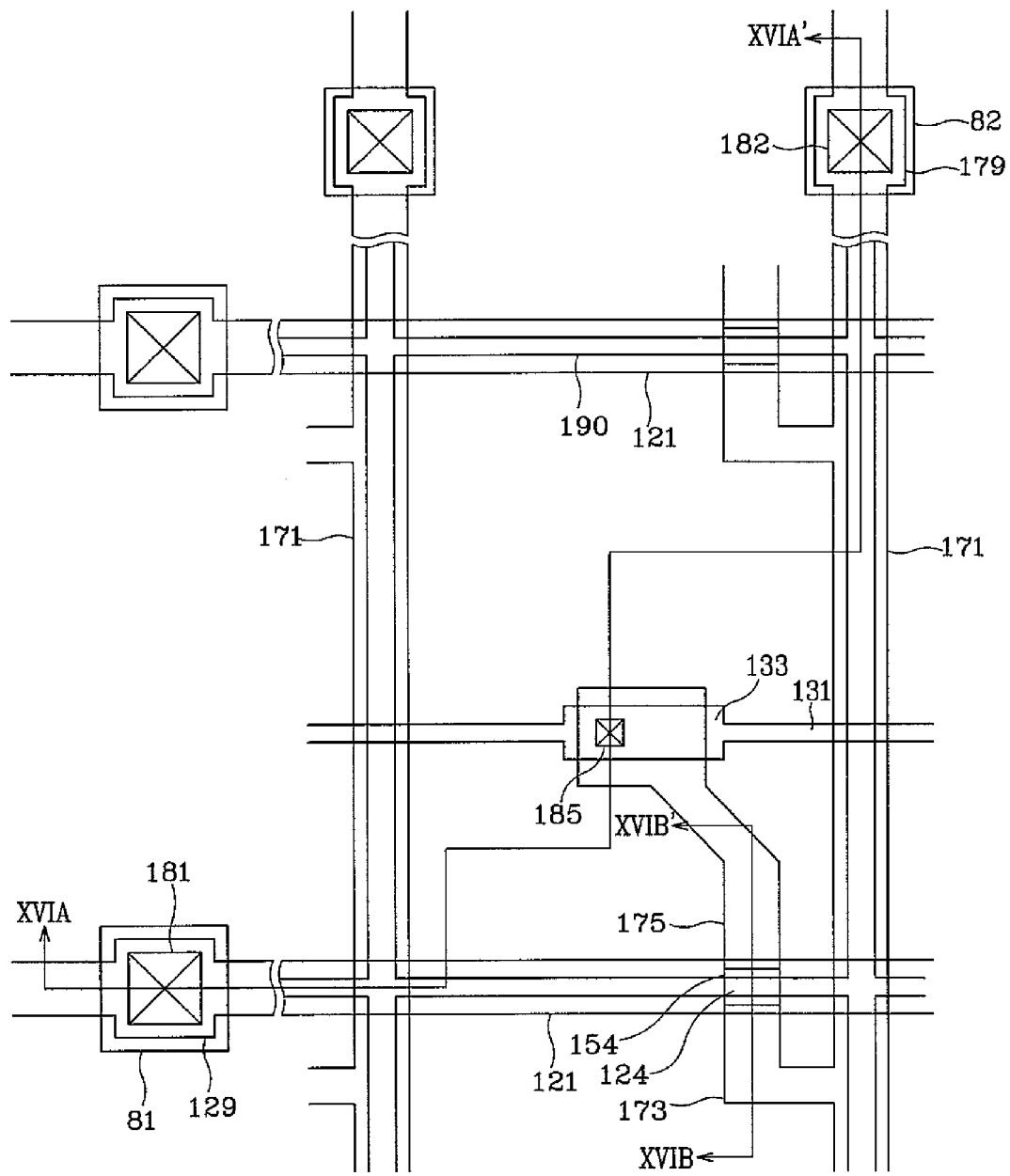
FIG. 15 is a layout view of a TFT array panel for an LCD according to another embodiment of the present invention.
Figure 16A:
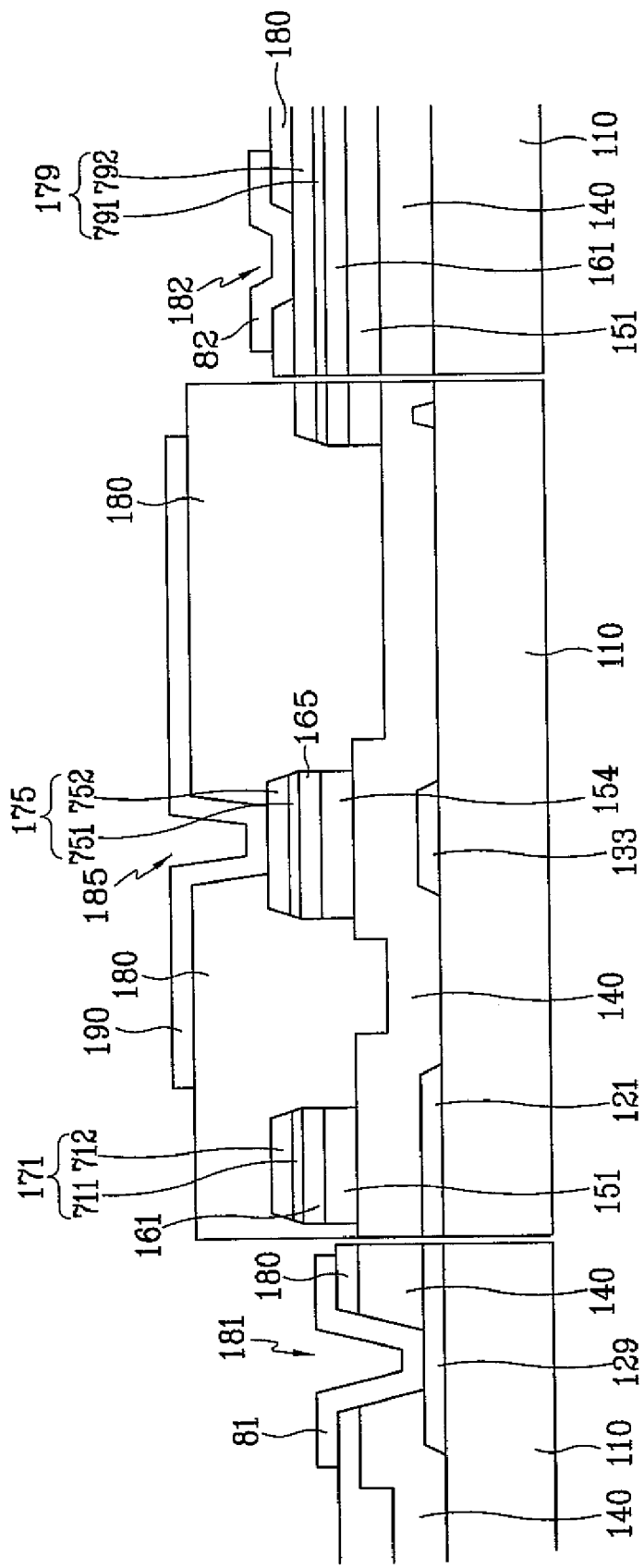
FIG. 16A is a sectional view of the TFT array panel shown in FIG. 15 taken along the line XVIA-XVIA'.

FIG. 15 is a layout view of a TFT array panel for an LCD according to another embodiment of the present invention, FIG. 16A is a sectional view of the TFT array panel shown in FIG. 15 taken along the line XVIA-XVIA', and FIG. 16B is a sectional view of the TFT array panel shown in FIG. 15 taken along the lines XVIB-XVIB'.

Referring to FIGS. 15-16B, a layered structure of the TFT array panel according to this embodiment is almost the same as those shown in FIGS. 1 and 2.

That is, a plurality of gate lines 121 including a plurality of gate electrodes 124 are formed on a substrate 110, and a gate insulating layer 140, a plurality of semiconductor stripes 151 including a plurality of projections 154, and a plurality of ohmic contact stripes 161 including a plurality of projections 163 and a plurality of ohmic contact islands 165 are sequentially formed thereon. A plurality of data lines 171 including a plurality of source electrodes 173 and a plurality of drain electrodes 175 are formed on the ohmic contacts 161 and 165, and a passivation layer 180 are formed thereon. A plurality of contact holes 182 and 185 are provided at the passivation layer 180 and the gate insulating layer 140, and a plurality of pixel electrodes 190 and a plurality of contact assistants 82 are formed on the passivation layer 180.

Different from the TFT array panel shown in FIGS. 1 and 2, the TFT array panel according to this embodiment provides a plurality of storage electrode lines 131, which are separated from the gate lines 121, on the same layer as the gate lines 121 without providing projections at the gate lines 121. The storage electrode lines 131 are supplied with a predetermined voltage such as the common voltage. Without providing the storage capacitor conductors 177 shown in FIGS. 1 and 2, the storage electrode lines 131 includes a plurality of storage electrodes 133 having a large area and the drain electrodes 175 extend to overlap the storage electrodes 133 to form storage capacitors. The storage electrode lines 131 may be omitted if the storage capacitance generated by the overlapping of the gate lines 121 and the pixel electrodes 191 is sufficient. The storage electrode lines 131 may be disposed near the gate lines 121 to increase the aperture ratio.

In addition, the semiconductor stripes 151 have almost the same planar shapes as the data lines 171 and the drain electrodes 175 as well as the underlying ohmic contacts 161 and 165. However, the projections 154 of the semiconductor stripes 151 include some exposed portions, which are not covered with the data lines 171 and the drain electrodes 175, such as portions located between the source electrodes 173 and the drain electrodes 175.

Furthermore, the data lines 171 and the drain electrodes 175 have a double-layered structure including a lower film 711 and 751 preferably made of Al containing material, and an upper film 712 and 752 preferably made of Cr or Mo containing metal. In FIGS. 8 and 9, the lower and upper films of the source electrodes 173 are indicated by reference numerals 731 and 732, respectively, and the lower and upper films of end portions 179 of the data lines 171 are indicated by reference numerals 791 and 792, respectively. However, the gate lines 121 and the storage electrode lines 131 have a single layer structure.

Moreover, the gate lines 121 and the data lines 171 have expanded end portions 129 and 179, respectively. Accordingly, a plurality of contact holes 181 exposing the end portions 129 of the gate lines 121 are provided at the gate insulating layer 140 and the passivation layer 180, and a plurality of contact assistants 81 connected to the end portions 129 through the contact holes 181 are additionally provided.

The peripheral area of the TFT array panel shown in FIGS. 15-16B may have the configuration shown in FIG. 3, 14A or 14B.

Many of the above-described features of the TFT array panel for an LCD shown in FIGS. 1-4 may be appropriate to the TFT array panel shown in FIGS. 15-16B.

As described above, the embodiments of the present invention make the contact portions of the passivation layer thinner than other portions, thereby preventing the defect in the contact due to the height difference. Furthermore, the embodiments give slopes having an inclination angle preferably smaller than about 45 degrees between the thinner portion and the thicker portion, thereby preventing unwanted conductor patterns from being remained to prevent the short circuit with the external devices.

While the present invention has been described in detail with reference to the preferred embodiments, those skilled in the art will appreciate that various modifications and substitutions can be made thereto without departing from the spirit and scope of the present invention as set forth in the appended claims.

What is claimed is:

1. A method of manufacturing a thin film array panel, the method comprising:
    forming a gate conductor formed on a substrate;
    forming a gate insulating layer on the gate conductor;
    forming a semiconductor layer on the gate insulating layer;
    forming a data conductor at least on the semiconductor layer;
    forming a passivation layer on the semiconductor layer, the passivation layer including a first portion having a contact hole on one of the gate conductor or the data conductor for connection with an external device, a second portion thicker than the first portion, and a third portion disposed between the first portion and the second portion and having an inclined angle smaller than about 45 degrees; and
    forming a pixel electrode connected to the drain electrode and a contact assistant connected to either the gate conductor or the data conductor,
    wherein the contact assistant is disposed only on the first portion.

2. The method of claim 1, wherein the inclination angle of the third portion is in a range about 5-10 degrees.

3. The method of claim 1, wherein the formation of the passivation layer comprises light exposure using a mask including a first area facing the first and the third portions of the passivation layer and partly transmitting light, a second area facing the contact hole and substantially fully transmitting light, and a third area facing the second portion and substantially fully blocking light.

4. The method of claim 3, wherein the first area comprises a plurality of slits or a plurality of lattices.

5. The method of claim 4, wherein the distance between the slits or the lattices is increased or the width of the slits or lattices is decreased as goes to the third area.

6. The method of claim 4, wherein the slits include a plurality of first slits facing the first area and a plurality of second slits facing the third area, the distance between the first slits being substantially constant and the distance between the second slits being increased as goes to the third area.

7. The method of claim 1, wherein the passivation layer comprises organic insulator.

8. The method of claim 1, wherein the pixel electrode and the contact assistant comprise indium tin oxide or indium zinc oxide.

* * * * *